(12) United States Patent  
Callahan

(10) Patent No.: US 7,085,776 B2
(45) Date of Patent: Aug. 1, 2006

(54) LOGICAL HIERARCHICAL DATA MODEL FOR SHARING PRODUCT INFORMATION ACROSS PRODUCT FAMILIES

(75) Inventor: Sean M. Callahan, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 245 days.

(21) Appl. No.: 10/128,922

(22) Filed: Apr. 24, 2002

(65) Prior Publication Data

US 2003/0204527 A1   Oct. 30, 2003

(51) Int. Cl.
*G06F 7/00* (2006.01)
*G06F 19/00* (2006.01)

(52) U.S. Cl. .............. 707/104.1; 707/100; 707/102; 700/95; 700/97; 703/1

(58) Field of Classification Search ............ 700/29, 700/30, 95, 97, 98, 106, 182; 707/104.1, 707/1, 100, 102; 703/1, 6, 13; 345/713
See application file for complete search history.

(56) References Cited

U.S. PATENT DOCUMENTS

| | | | |
|---|---|---|---|
| 1,357,486 A | | 11/1920 | Bennett |
| 5,119,307 A | | 6/1992 | Blaha et al. |
| 5,311,424 A | | 5/1994 | Mukherjee et al. |
| 5,434,791 A | | 7/1995 | Koko et al. |
| 5,552,995 A | * | 9/1996 | Sebastian .................... 700/97 |
| 6,223,094 B1 | * | 4/2001 | Muehleck et al. .......... 700/107 |
| 6,430,730 B1 | | 8/2002 | Ghatate et al. |
| 6,611,725 B1 | * | 8/2003 | Harrison et al. ............. 700/98 |

2003/0237057 A1   12/2003  Riedl et al.

FOREIGN PATENT DOCUMENTS

| | | |
|---|---|---|
| EP | 0 520 927 A2 | 12/1992 |
| EP | 1 357 486 A2 | 10/2003 |
| EP | 1 447 760 A2 | 8/2004 |
| WO | WO 86/00735 | 1/1986 |

OTHER PUBLICATIONS

Gu et al., "Product modelling using STEP," Computer-Aided Design, vol. 27, No. 3, Mar. 1995.
Fouda et al., "A Heuristic to Generate a Precedence Graph Between Components for a Product Family," M1B-3 14.10, Proceedings of the 4th IEEE, Int'l. Symposium on Assembly and Task Planning, May 28-29, 2001.

(Continued)

*Primary Examiner*—Leo Picard
*Assistant Examiner*—Charles Kasenge
(74) *Attorney, Agent, or Firm*—Harness Dickey & Pierce P.L.C.

(57) ABSTRACT

An apparatus and method for a logical hierarchical data model that facilitates sharing design data definitions within product families. The product data model is stored in a memory or a database and holds product information relating to components. The product data model comprises a plurality of component-usages for including a component in a higher-level-assembly and logical component-usages associated with the component-usages. Each logical component usage selects one of the component-usages that perform the same role within the context of its parent assembly. A generalized occurrence structure has nodes that represent the paths in a product data model of an assembly, from which simple occurrence structures representing each individual configuration can be derived.

10 Claims, 13 Drawing Sheets

OTHER PUBLICATIONS

Dassault Systems, "OMG Manufacturing Domain Task Force MDTF-RFP 1 Submission: Product Data Management Enablers Proposal," Revision 1.0, XP-002327057, Apr. 14, 1997.

Wongvasu et al., "Representing the relationship between items in logical bill-in-material to support customers' request for quotation for make-to-order products," XP-002307659, Intelligent Systems in Design and Manufacturing III, Proceedings of SPIE vol. 4192 (2000).

Wongvasu et al., "Trie Representation for Expressing the Compatibility Between Items in a Logical Bill of Material Structure," XP-002307762, Intelligent Systems in Design and Manufacturing IV, Proceedings of SPIE vol. 4565 (2001).

* cited by examiner

A Product Data Model

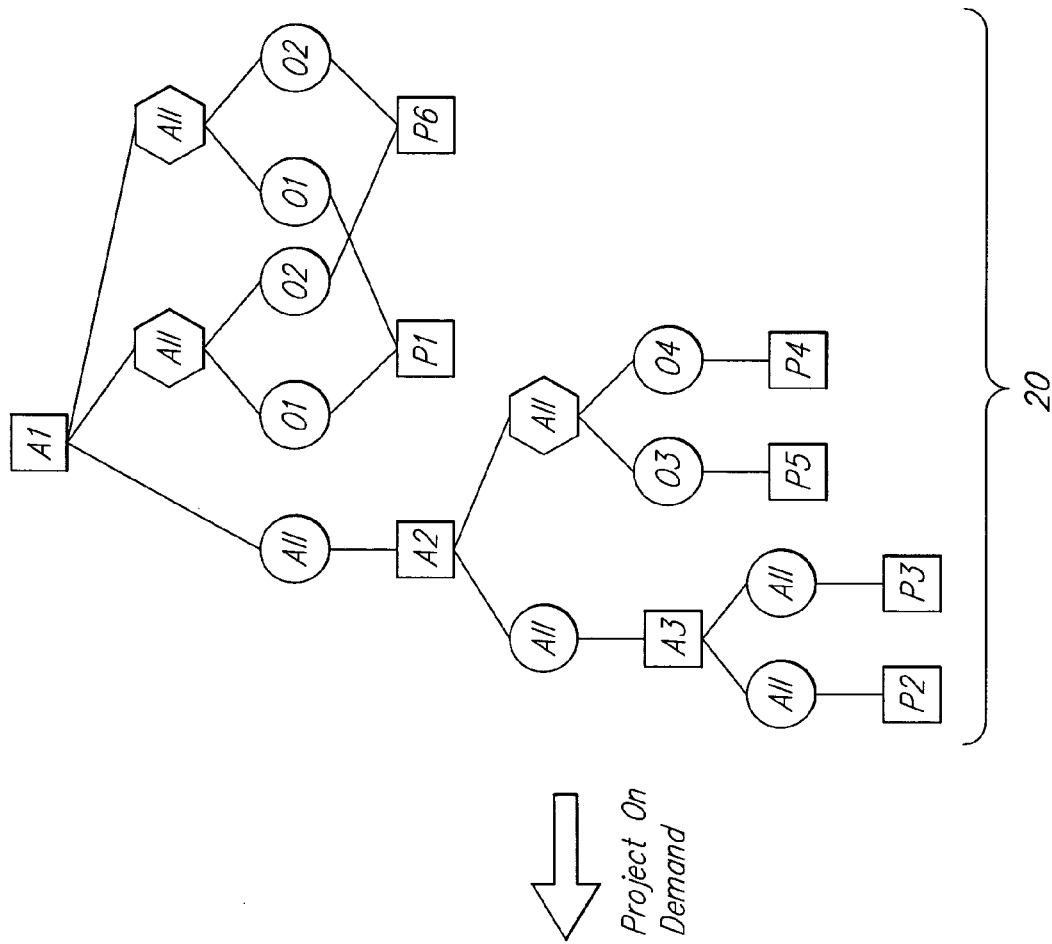
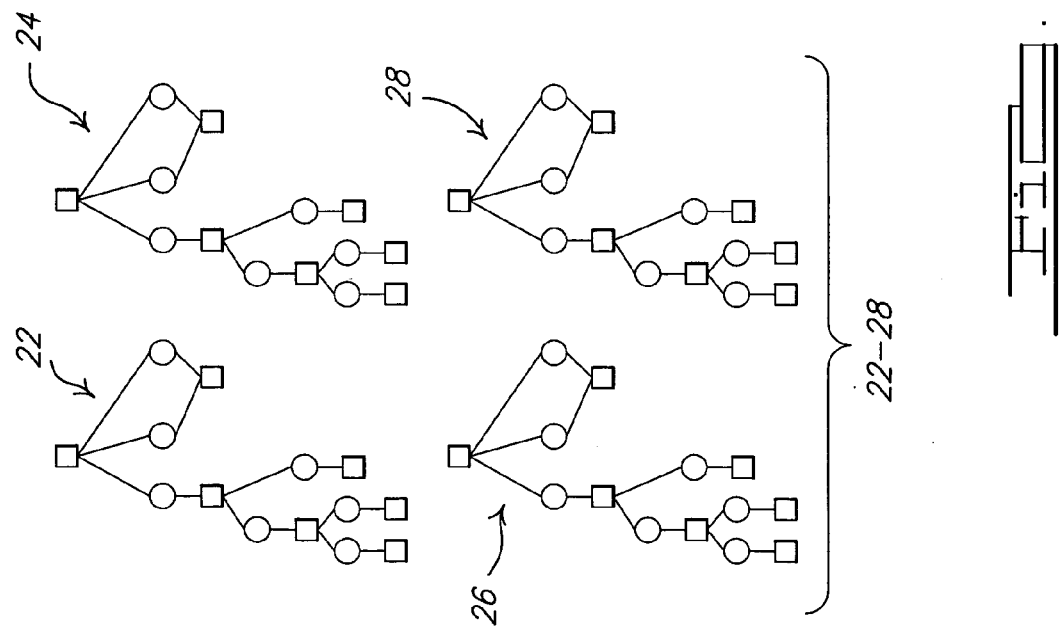
FIG. 3B.

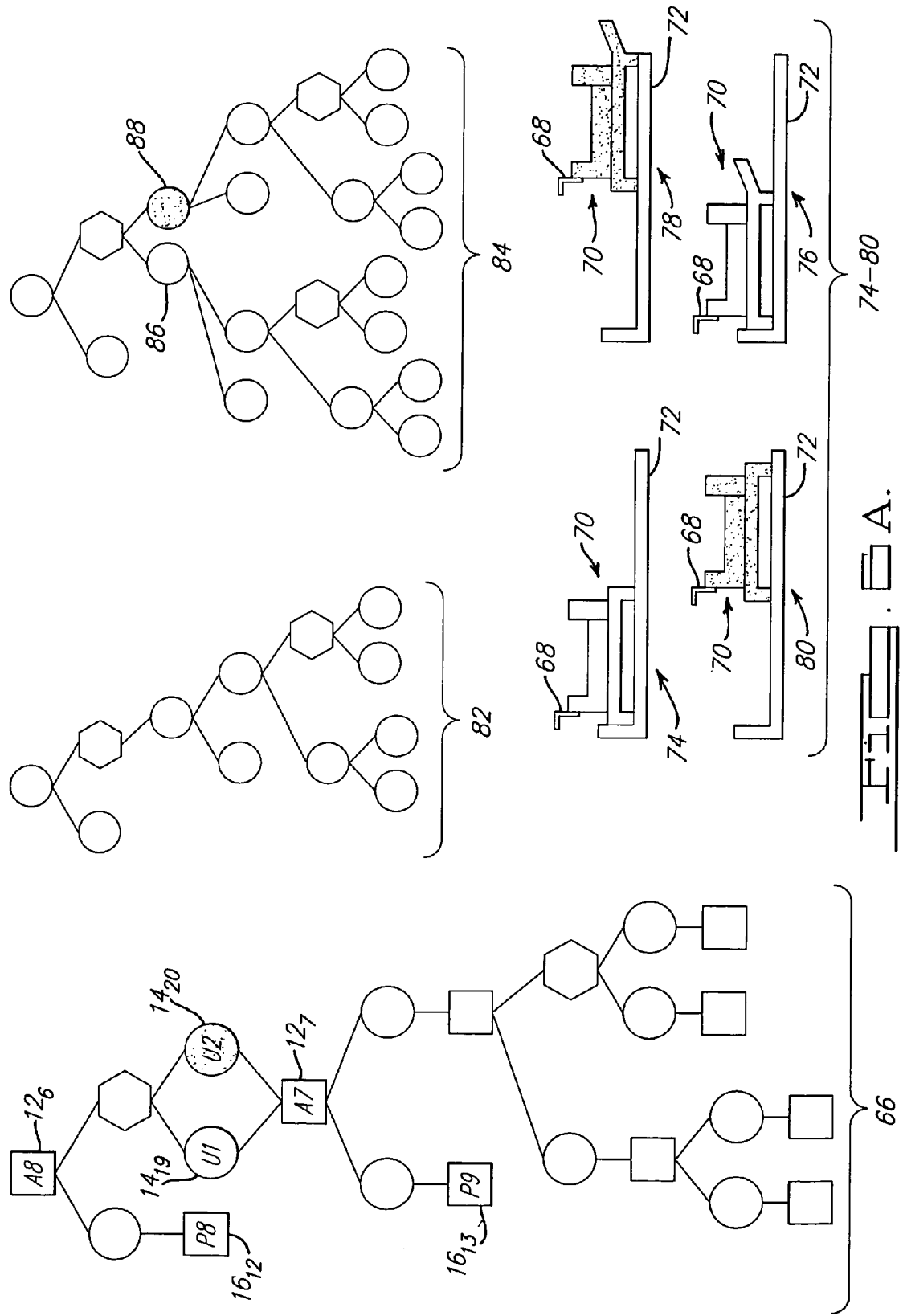

LOGICAL HIERARCHICAL DATA MODEL FOR SHARING PRODUCT INFORMATION ACROSS PRODUCT FAMILIES

FIELD OF THE INVENTION

The present invention relates to data architectures, and more particularly to product information related data architectures that can be used to share product information across product families.

BACKGROUND OF THE INVENTION

Increasingly, products are designed using computer aided design (CAD) systems and then manufactured in computer aided manufacturing (CAM) environments. Large engineering projects and complex product designs have increased the need for computer based product related information like CAD designs, CAM instructions and assembly interrelationships. Thus, product designs and related data are being collated on a large scale for storage and processing on computer systems.

A product family consists of products sharing certain common characteristics. For example, all components in a product family used in an aircraft pumping system may share a common "hydraulic system design". This doesn't mean, however, that all products in the family share the same hydraulic components. The aircraft size determines the individual hydraulic component characteristics of the pumping system, e.g., pump capacity, and the characteristics of its associated components may change, e.g., tubing routes. But the overall hydraulic architecture of the aircraft pumping system remains the same. It is important that a virtual product modeling system be capable of operating on the product "family" as a whole unit.

Ideally, with a large number of products being designed using CAD systems, virtual product modeling should be easily possible. Virtual product modeling can expedite the design process for a family of products sharing an overall product architecture. However, conventional computer systems are unable to capture a critical fraction of the product data for a family of products necessary to perform virtual product modeling. A required degree of flexibility in a virtual product modeling process for modeling a family of products is not feasible with conventional computer systems. Hence, there is a need for a system capable of capturing a critical reusable quantum of product data for a family of products making flexible virtual product modeling feasible.

Customizing a given product from a product family also presents limitations to the designer. A designer can customize a product selected from a product family, which includes many product variants. Manufacturers typically face logistical problems in tracking the information about variants. Typical problems involve tracking which parts are contained in a given variant, determining what technical data is applicable to a given variant, determining how the technical data maps on to a manufacturing plan, and how does a given manufacturing plan account for all the parts in a given engineering design. At present, a designer reconstructs relationships between product design domains either mentally or with some minimal computer support. Manual tracking of such relationships incurs high costs and is prone to errors. Thus, there exists a need for a computer-based system to effectively manage relationships between product design domains.

Methods for defining and managing the relationship of variants to the product family exist. One such method is termed "the effectivity method." Traditional effectivity defines which parts go into each end product configuration. Presently, the trend in the industry is less and less use of traditional effectivity. Reduced use of effectivity means diminishing the knowledge about what is common among different product designs. Thus, there is a need to capture the knowledge about common characteristics of differing product designs.

When a change is made to a particular product assembly, manufacturing planners get an entirely new assembly definition instead of just the specific changes to that particular product assembly. Manufacturing planners then have to perform significant manual labor to discover the specific minor changes and existing commonality between old and new assembly definitions. This leads to avoidable extra cost in manufacturing planning.

As the industry increasingly uses CAD designs for modeling products, there will be a need to harmonize CAD designs for a product family having numerous variants. Typical CAD systems can model product assembly structure as part of a three dimensional CAD design for a single variant. Such CAD systems cannot share assembly-level structure among several assembly variants. Thus, designers are forced to maintain multiple and independent CAD designs for variants. Multiplicity of variant designs creates an undesirable situation where there are many copies of engineering and bill-of-materials assembly definitions that are similar, but have unique copies of product structure definitions. Thus, there is a need to eliminate multiple and independent drawings, CAD data and product structure for variants.

SUMMARY OF THE INVENTION

The present invention relates to a hierarchical product data model for storing product data in a memory associated with a computer, and in a persistent storage database, capable of bringing the product data model into computer memory for use by designers. The part used-on assembly information has an important role in product information. The product data model facilitates sharing of product information within a product family.

The traditional Product Data Model may be derived from this model by deleting the Logical Component Usage object and relationships 2, 3, 5 and the {OR} constraint represented by the dotted line.

A parent assembly holds information for associating the component with the parent assembly. Component-usages holds information relating to usages of the component and connecting a child part to its parent assembly. Logical component-usages hold information relating to logical usages of components and connect child component usages to their parent assembly. The parent assembly, component-usage, and logical component-usage are hierarchically interconnected. The product data model that is the subject of this invention consists of an interrelated set of components, component-usages and logical component usages. The invention is independent of any effectivity or applicability scheme, but can accommodate multiple types of such schemes.

A generalized occurrence structure represents paths through such a product data model of an assembly. A simple occurrence structure forms a configuration specific tree, which can be projected from the generalized occurrence structure, and can be used to support tools that visualize and edit individual product configurations.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will be more fully articulated by the detailed description and the accompanying drawings, wherein:

FIG. 3B shows the projection of unique configurations from the original multivariant reusable assembly graph;

FIG. 6A illustrates a logical occurrence tree and a unique occurrence tree;

DETAILED DESCRIPTION OF THE PREFERRED EMBODIMENTS

The following description of the preferred embodiment(s) is merely exemplary in nature and is in no way intended to limit the invention, its application, or uses.

The description of the invention is merely exemplary in nature and, thus, variations that do not depart from the gist of the invention are intended to be within the scope of the invention. Such variations are not to be regarded as a departure from the spirit and scope of the invention.

A storage structure is required to store and process product related information. The most common example of a storage structure is a data structure implemented by a software system. Such a data structure may be embedded or stored in many different and application specific ways. Product data stored in the storage structure can be made available to various software tools. For example, a product data capture module can read various details of a component like the various assemblies in which the component fits in, the size of the component, and details about component that vary across according to product variant. This data can be shared in many ways. For example across applications like inventory, bill-of-materials and CAD systems. The product data captured in the product data model can also be shared across the product family irrespective of the application manipulating the product family, by storage in a database or any other persistent data storage mechanism, like a file.

Two crucial questions, among others, arise in the design of a product data model. The first question deals with what details to store. The second question deals with structural issues about how to store the details. When the optimum types of details are not stored, the product information may be of little utility across applications. The present invention uses a hierarchical structure to store the product details. Hierarchical structures allow improved capture and abstraction of product details along with providing flexibility in manipulating captured details. Hence, the present invention provides a hierarchical product data model, which can be shared in multiple ways.

Figure 1:
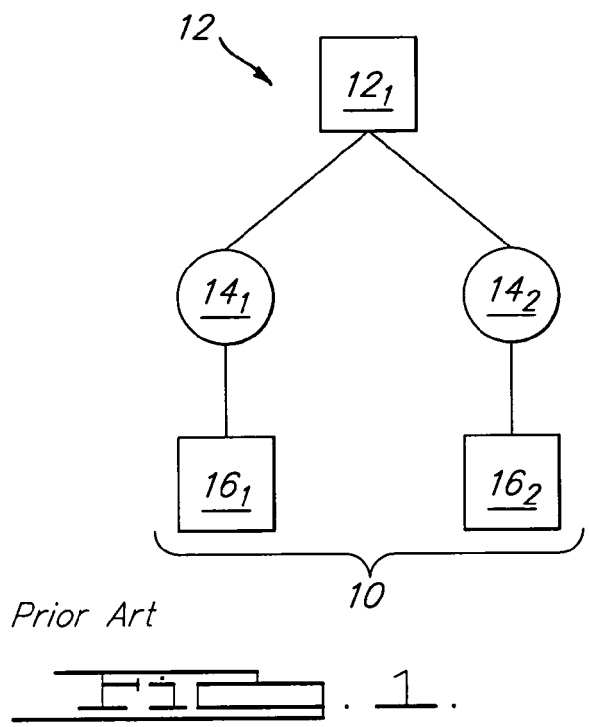
FIG. 1 shows a prior art component representation.

FIG. 1 shows a prior art component representation. Two components 10 are included by a parent assembly 12. For explanatory purposes, individual parent assemblies 12 in all the figures are labeled as $12_n$, where the subscript 'n' indicates a particular instance of the parent assembly 12 in a given embodiment. Component usage nodes, $14_1$ and $14_2$, connect to the parent assembly $12_1$. The individual component usage nodes 14 in all of the figures are labeled as $14_n$, where the subscript 'n' indicates a particular instance of the component usage node in a given embodiment. Child components 16 are associated with the parent assembly 12 through the component usage nodes 14. Individual leaf child components 16 in all the figures are labeled $16_n$, where the numeric subscript 'n' indicates a particular instance of a child component 16 in a given embodiment. A leaf component is defined to contain no child component usages. In the context of FIG. 1, the component usage nodes $14_1$ and $14_2$ act as links to include child components $16_1$ and $16_2$ in the parent assembly $12_1$.

Figure 2:
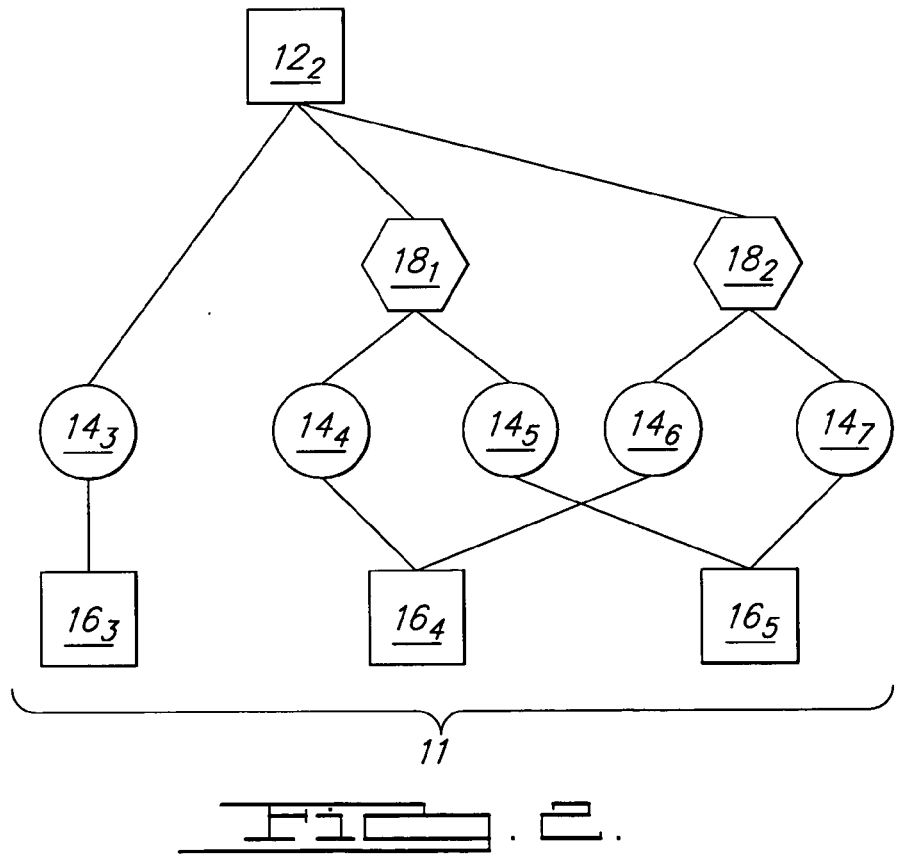
FIG. 2 is a representation of a product data model in accordance with a preferred embodiment of the present invention.

FIG. 2 shows a product data model 11 in accordance with a preferred embodiment of the present invention. The product data model 11 includes logical component usage nodes 18. The nodes 18 associate one parent assembly 12 with one or more component usage nodes 14. Any effectivity or applicability scheme used must preferably ensure that for any one valid assembly configuration of the parent assembly 12 using the logical component usage node 18, there is only one component usage node 14. This is ensured by the logical component usage node 18, which determines which one of the multiple (if any) component usage nodes 14 associated with it becomes part of the given valid assembly configuration of the parent assembly 12. FIG. 2 shows that a valid assembly configuration having parent assembly $12_2$ may have one or a plurality of component usages 14. In this illustration, the data model is shown as having three possible component usages 14, including $14_3$ and those usages selected by logical component usages $18_1$ and $18_2$. It will be appreciated, however, that a greater or lesser plurality of logical component usages 18 can be included to describe a particular product assembly. In the specific example shown in FIG. 2, one of the three would be component usage $14_3$; of the remaining four usages, $14_4 \rightarrow 14_7$, one will be selected by $18_1$ between $14_4$ and $14_5$ and the other will be selected by $18_2$ between $14_6$ and $14_7$. Logical component usage identifies that a role for a component usage exists in an assembly and also stores the implementing component usages.

Figure 3A:
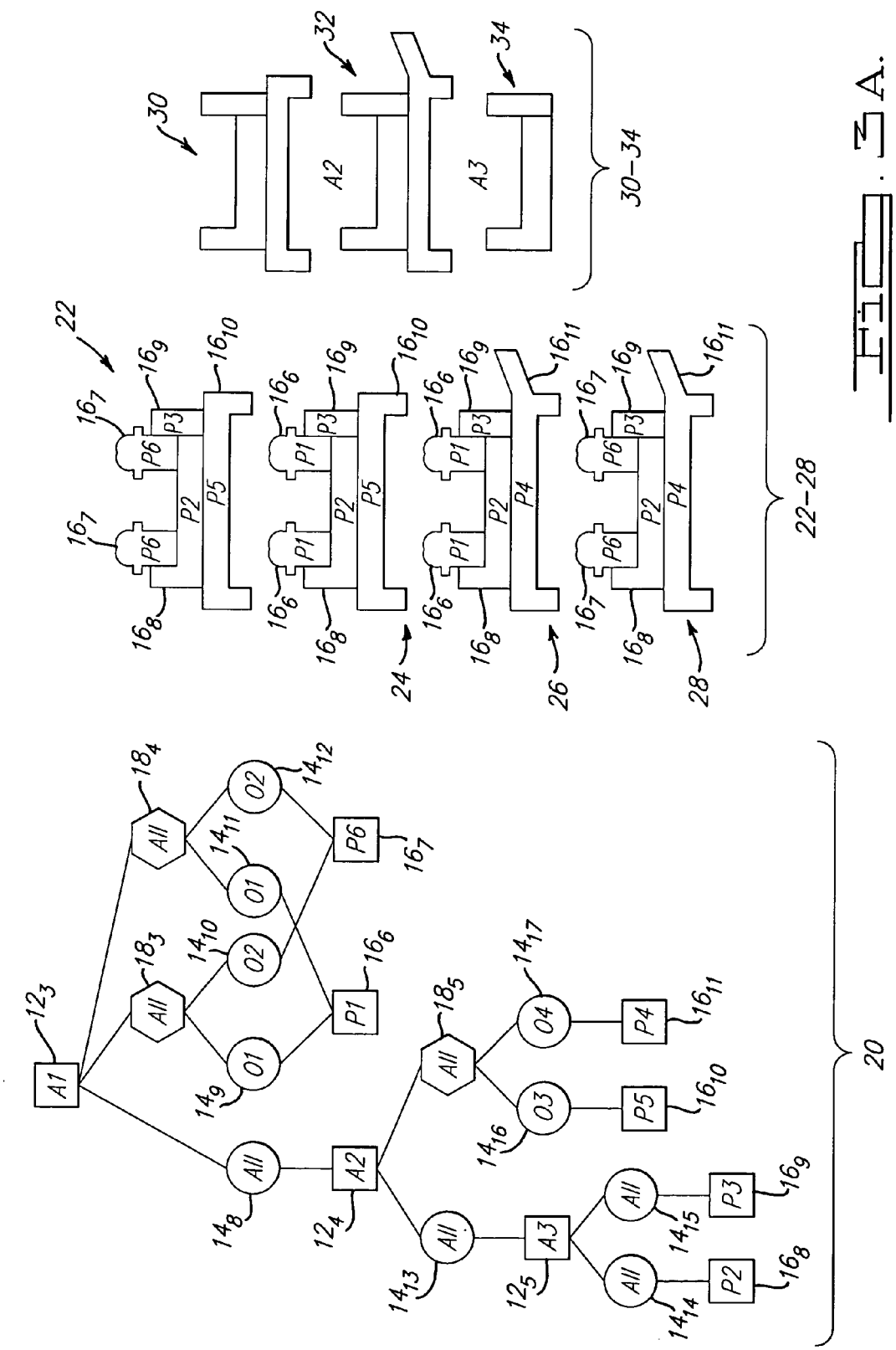
FIG. 3A illustrates an example of one way in which an applicability scheme may be applied to the present invention to determine the components used on a given configuration.

FIG. 3A illustrates the applicability of components to a given configuration. The first graph 20 includes three parent component nodes $12_3$–$12_5$. The component usage nodes 14 and the logical component usage nodes 18 are labeled with applicability attributes that determine whether they apply to a given configuration. For example, let the child component $16_6$ represent a large pump and $16_7$ represent a small pump. The option attribute "O2" is shown inside the component usage nodes $14_{10}$ and $14_{12}$ that are connected to the child component $16_7$ representing small pumps. Thus, the presence of the small pump option on an assembly is turned "on" by the presence of the "O2" option attribute. Similarly, the presence of the large pump option is turned "on" by the presence of the "O1" option attribute, shown inside the component usage nodes $14_9$ and $14_{11}$. It is assumed that the options "O1" and "O2" are mutually exclusive. In the same way, option attribute "O3" shown inside the component usage node $14_{16}$ is used to select child component $16_{10}$. Likewise, option attribute "O4" shown inside the component usage node $14_{17}$ is used to select child component $16_{11}$.

The parent assembly 12 can have multiple valid configurations. For example, the parent assembly $12_3$ could have four valid configurations that are shown as first A1 configuration 22, second A1 configuration 24, third A1 configuration 26 and fourth A1 configuration 28. Similarly, the parent assembly $12_4$, shown as embedding a tag "A2," could have two configurations that are shown as first A2 configuration 30 and second A2 configuration 32. The parent assembly $12_5$ shown as embedding a tag "A3" has only one configuration that is shown as first A3 configuration 34.

The first A1 configuration 22 shows an arrangement and a view of the child components $16_6$–$16_{11}$. Similarly, the second A1 configuration 24, third A1 configuration 26 and fourth A1 configuration 28 are shown as including arrangements and views of the child components $16_6$–$16_{11}$.

The invention enables capturing of design sharing between product configurations using a data model. For example, the four configurations, i.e., the first A1 configuration 22, second A1 configuration 24, third A1 configuration 26 and fourth A1 configuration 28 could have different and unrelated part-usage objects for each assembly configuration. However, due to design sharing, common or similar parts are identically numbered across configurations.

Any suitable scheme of applicability can be implemented within the scope of the invention. The present invention is not limited by a particular manner of implementing an applicability scheme. For example, an explicit applicability attribute could be associated with each of the usage nodes specifying which configurations include each particular usage node. Alternatively, option attributes can be associated with the usage nodes and their applicability determined by an option expression developed for each product configuration. Further, a versioning scheme could be implemented where different versions of a given part include different version of the usage nodes contained within them, sharing those held in common. A combination of effectivity and versioning could then enable two configurations of an assembly to be applicable within one single product configuration.

FIG. 3B shows the projection of configurations, which could be used to provide single variant views, from the original multi-variant reusable assembly graph. Using the first graph 20, the four configurations, i.e., the first A1 configuration 22, second A1 configuration 24, third A1 configuration 26 and fourth A1 configuration 28, can each be projected in a view so that they appear as simple assembly definitions, each describing one assembly configuration.

Figure 4:
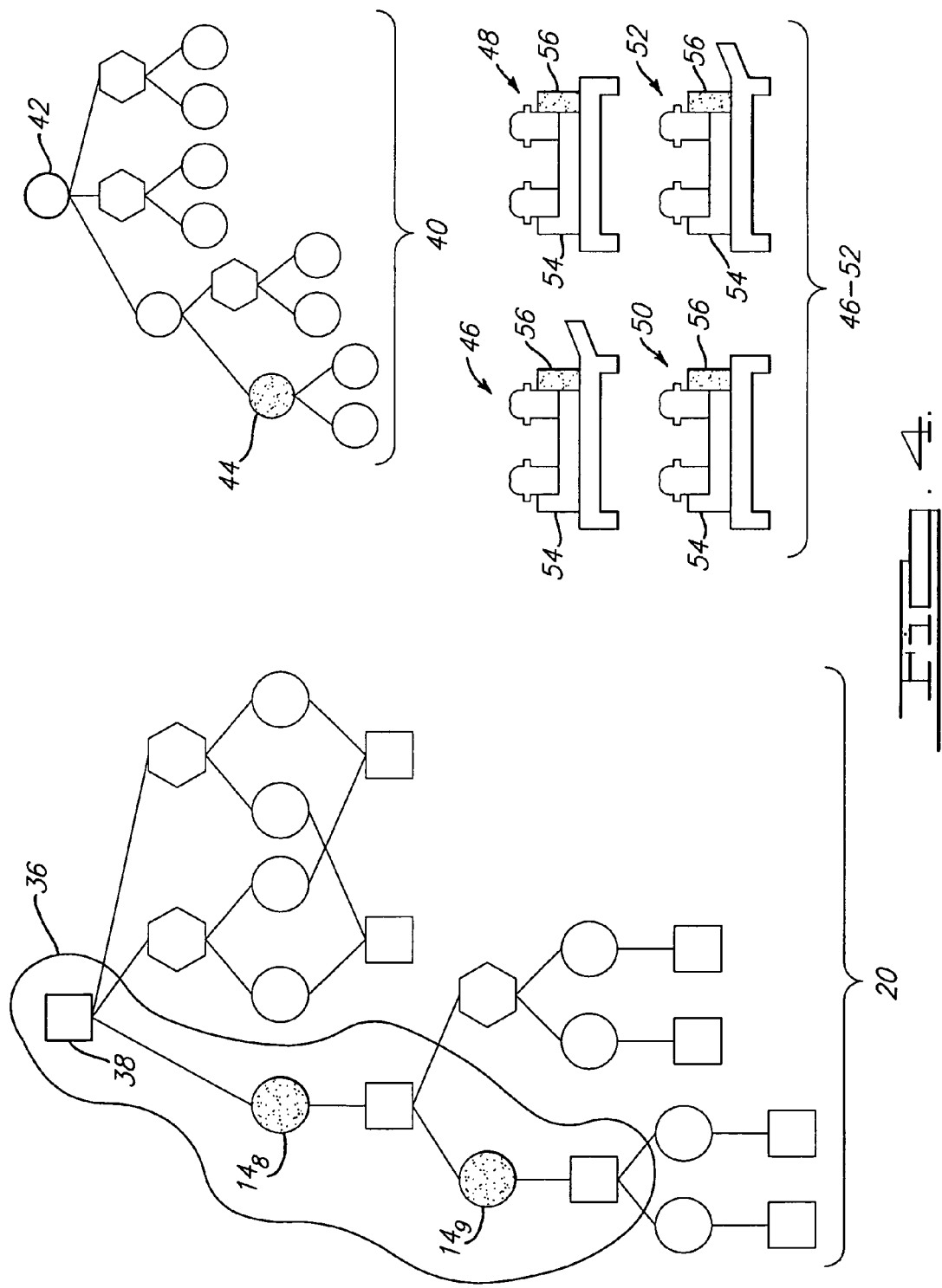
FIG. 4 illustrates a generalized occurrence tree.

FIG. 4 illustrates a generalized occurrence tree, which are always associated with one particular component. For example, the generalized occurrence tree 40 represents the assembly level component 38. Nodes in the occurrence tree correspond to top-to-bottom paths that run from the root of the assembly tree to a usage or to logical usage below the that root assembly. For example, the path 36 runs from the root assembly part 38, through usage node $14_8$ and to the usage node $14_9$. The occurrence nodes of this occurrence tree also correspond to specific parts that would occurrence if a valid configuration of assembly 38 were created. Of course, not all nodes would occur in all product configurations. A simple occurrence tree corresponding to each valid product configuration can be built by applying a projection operation on the generalized occurrence tree 40.

Figure 5A:
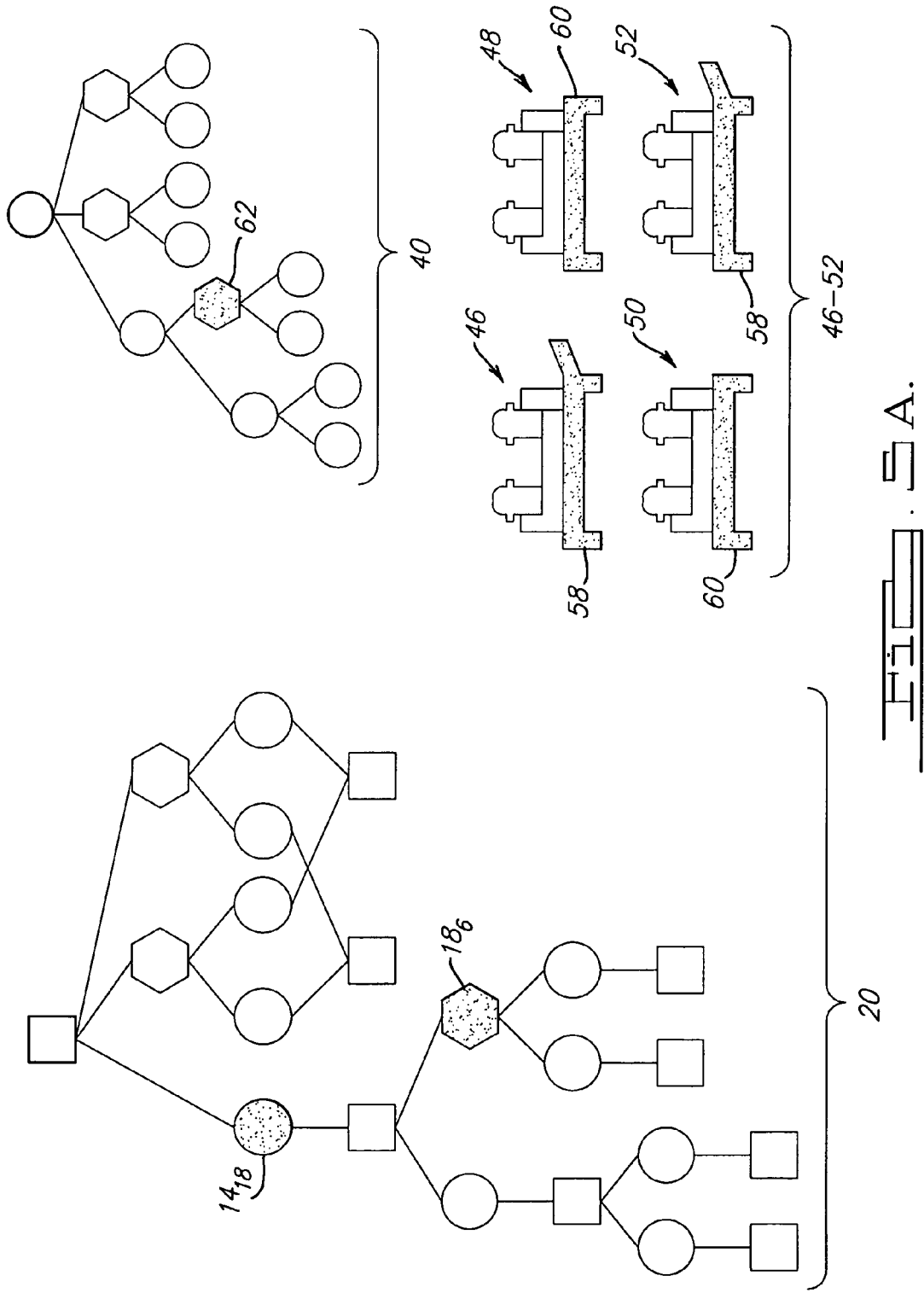
FIG. 5A illustrates the association of information with a part occurrence, where such information is relevant only to a subset of its total applicability range.

Referring to FIG. 5A, in certain cases, there will be a need to associate information with a part occurrence, but where such information is relevant only to a sub-set of its total applicability range. Such information must be qualified with relevant applicability statements. For example, the logical component usage $18_6$ is reflected in the occurrence tree 40 as a logical occurrence node 62. The logical occurrence node 62 represents the fact that exactly one of either first base 58 or second base 60 is required for constructing any of the assemblies 46–52.

Figure 5B:
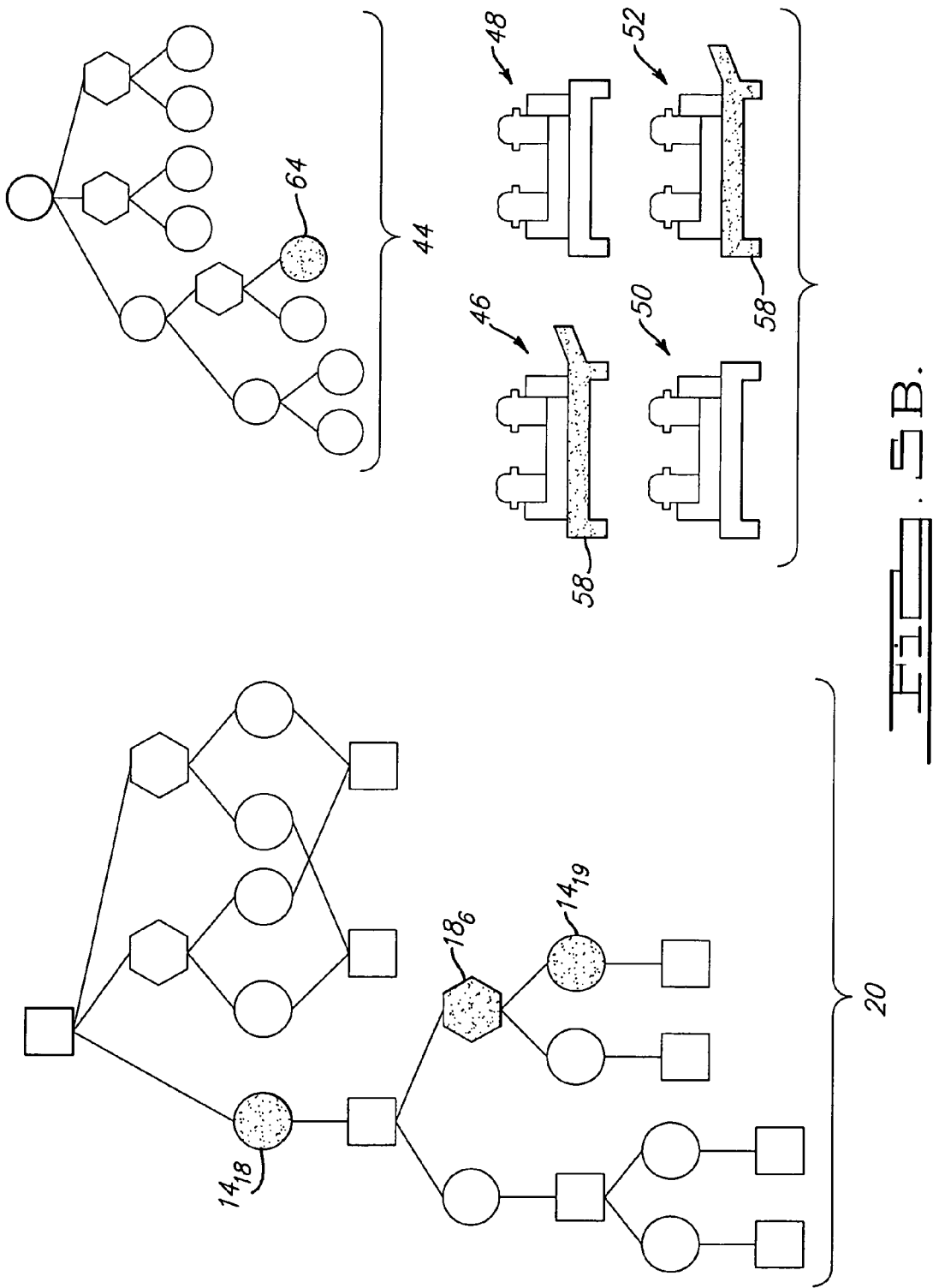
FIG. 5B further illustrates subject-matter of FIG. 5A.

Referring to FIG. 5B, the role of component usage node $14_{19}$ is reflected in a component usage occurrence node 64. The component usage occurrence node 64 represents the fact that the first base 58 is required to construct either the assembly 46 or the assembly 52. So, if information must be associated with the base 58 in assembly 46 but not in assembly 52, some applicability limitations would have to be applied to the data when it was associated with node 64.

FIG. 6A illustrates a logical occurrence tree and a unique tree. A common instance in product design is change of design due to relocation of a subset of the design to a different position with respect to the overall product's coordinate system. For example, a variant longer than the original is created by inserting plugs into a fuselage of a commercial aircraft. The invention facilitates easy representation selection and management of variants as illustrated below.

Second product data model 66 consists of parent assembly $12_6$ with an inside label "A8", and another parent assembly $12_7$ with an inside label "A7". A common flange bracket 68 is represented by child component $16_{13}$ and is attached to the upper left member of sub-assembly 70, represented by the parent assembly $12_7$. Sub-assembly 70 is itself attached to a large structural member 72, which is represented by the child component $16_{12}$. Location of attachment of the sub-assembly 70 to the large structural member 72 differs and hence creates variants. Two variants shown as first A8 configuration 74 and second A8 configuration 76 show one point of attachment of the sub-assembly 70 to the large structural member 72, while the other point of attachment is shown by the two variants shown as third A8 configuration 78 and fourth A8 configuration 80. All four variants are forms of the parent assembly $12_6$.

A logical occurrence tree 82 and a unique tree 84 are related to the second graph 66. The unique tree 84 is a generalized occurrence tree (as illustrated by FIG. 4). The component usage nodes $14_{19}$ and $14_{20}$ represent the two usages, which are shown as separate branches in the unique tree 84. The branch under the third occurrence node 86 represents the first A8 configuration 74 and the second A8 configuration 76 where the sub-assembly 70 is aligned to the left of large structural member 72. Similarly, another branch under the fourth occurrence node 88 represents the third A8 configuration 78 and the fourth A8 configuration 80 where the sub-assembly 70 is aligned to the right of large structural member 72. To refer to a particular configuration of the third A8 configuration 78 and the fourth A8 configuration 80, additional information needs to be appended to fourth occurrence node 88.

Figure 6B:
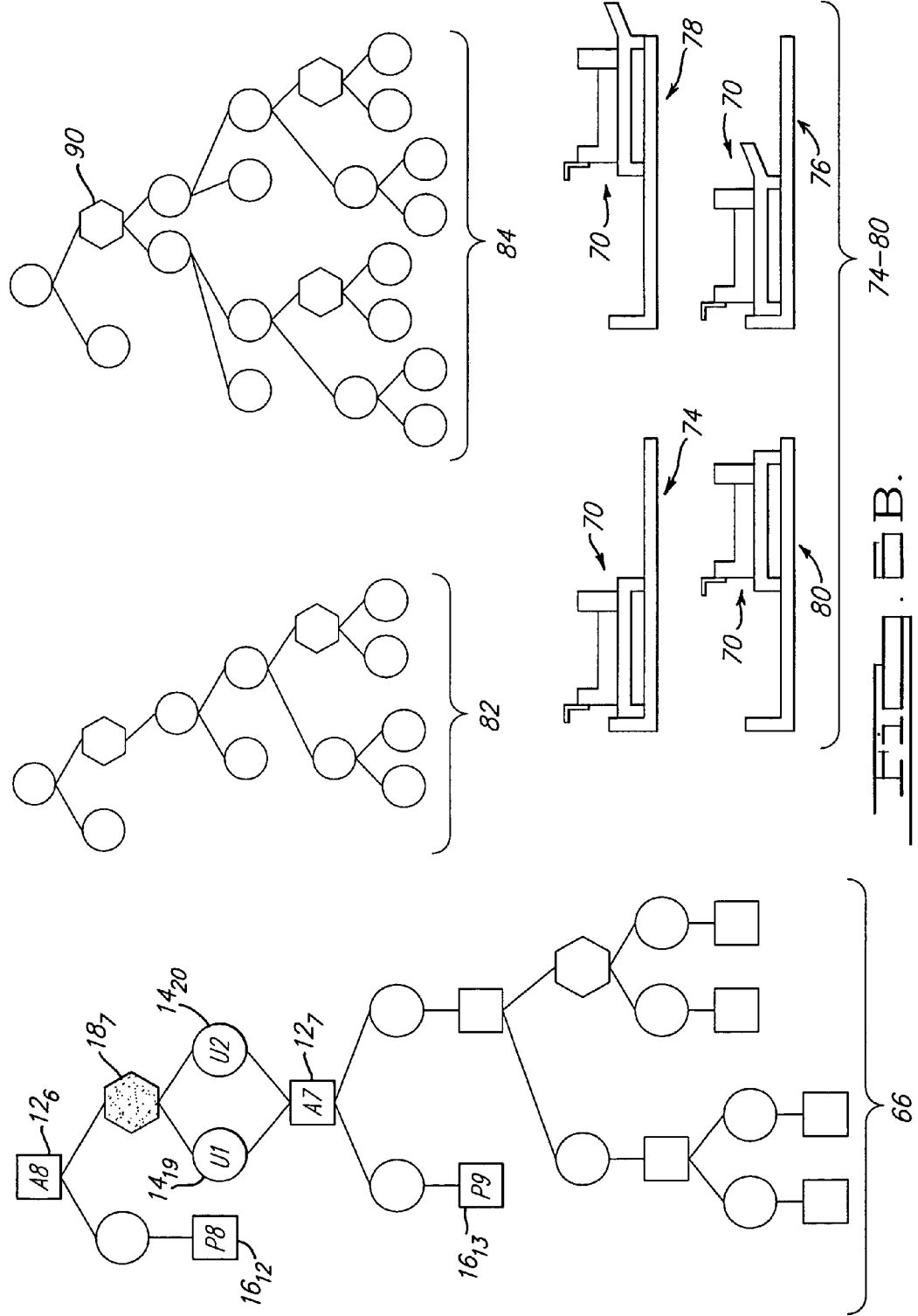
FIG. 6B further illustrates the logical occurrence tree and the unique occurrence tree.

Referring to FIG. 6B, the logical occurrence tree 84 has two branches representing two locations of the sub-assembly 70. The two branches are shown under the fifth logical occurrence node 90 in the logical occurrence tree 84. This arrangement is reflected in the second graph 66 in the role of logical component usage $18_7$ that selects either of component usage nodes $14_{19}$ or $14_{20}$ representing the two usages of the parent assembly $12_7$.

Figure 7:
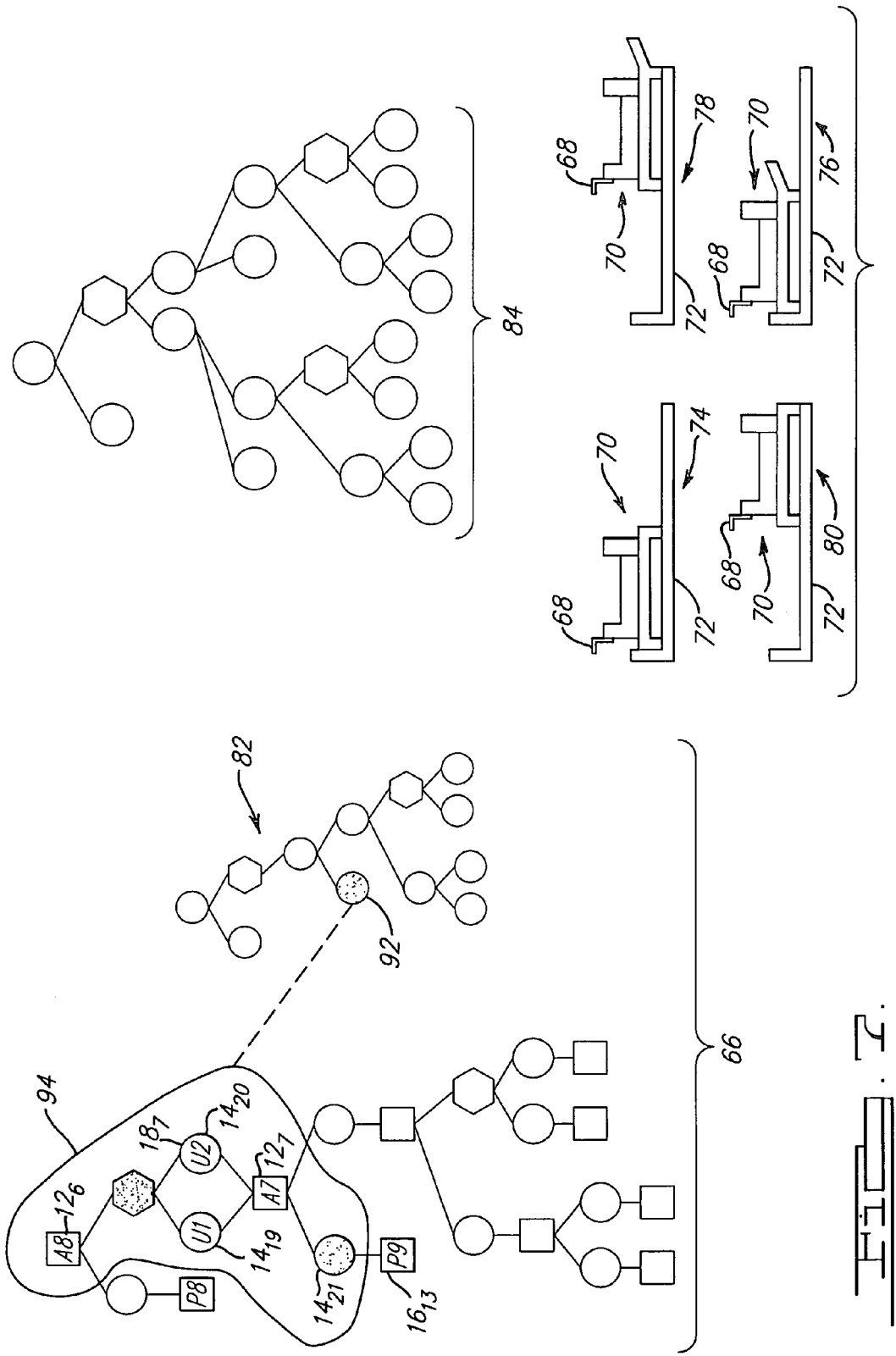
FIG. 7 shows an example product data model in which a subassembly is relatively displaced on one configuration versus another.

FIG. 7 shows the relative representations of the flange bracket 68. If some information needs to be associated with the presence of the flange bracket 68 in all four configurations, i.e., first A8 configuration 74, second A8 configuration 76, third A8 configuration 78 and fourth A8 configuration 80, it is achieved by associating such information with sixth occurrence node 92. The mechanism of a logical occurrence tree 82 requires only the path containing logical component usage $18_7$ and component usage node $14_{21}$ to specify the sixth occurrence node 92 in the unique occurrence tree, which indicates the presence of the flange bracket 68 in the aforementioned all four configurations. The group 94 covers both paths under component usage nodes $14_{19}$ and $14_{20}$. The coverage of both paths by the sixth occurrence node 92 is shown by its association with the group 94.

The present invention is broad enough to cover associated mechanisms. Examples of associated mechanisms are interface definition sharing between design variants and mappings between product design domains. These examples will now be discussed in detail.

Figure 8:
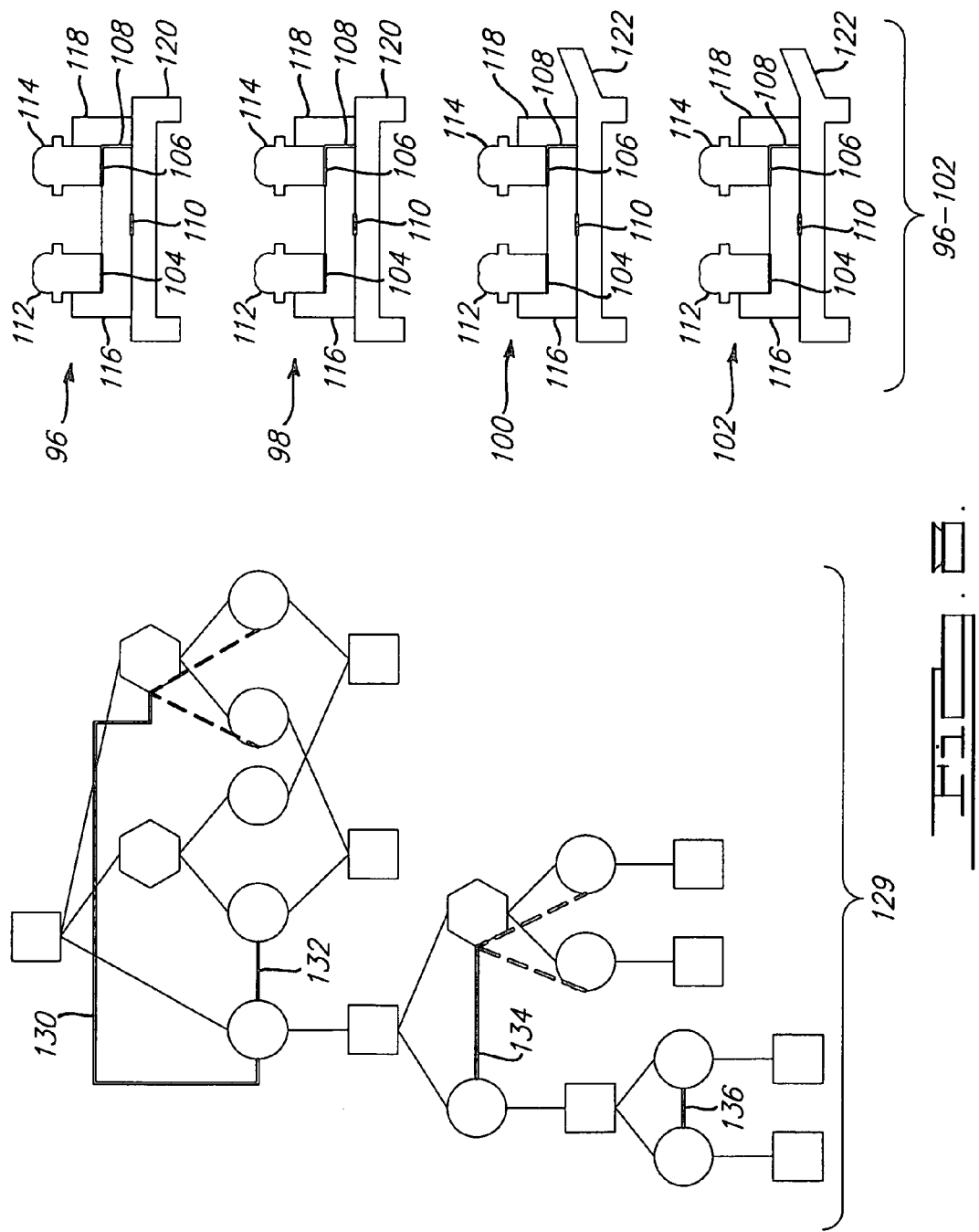
FIG. 8 shows the mechanism of CAD interface capture and PDM integration.

FIG. 8 shows the mechanism of CAD interface capture and PDM integration. The four assembly variants are shown as first assembly variant 96, second assembly variant 98, third assembly variant 100 and fourth assembly variant 102. In a conventional CAD assembly management system, each variant would require independent interfaces and interrelationship definitions. Conventional CAD assembly systems require one assembly file for each assembly. CAD part interface relationships facilitate orientation of parts with respect to each other, and therefore determining part usage locations.

Each part defines distinct ports and each usage of that part instantiates those ports, which may be connected to instantiated ports of other part usages, with a common parent assembly. Any two such part-usages can be connected by an interface joining their ports. The aforementioned four assembly variants 96–102 include four interfaces, i.e. first interface 104, second interface 106, third interface 108 and fourth interface 110. In assembly variants 96 and 98, part 112 connects to part 116 through the interface 104, part 114 connects to part 116 through the interface 106, part 116 connects to part 118 through the interface 108, and part 116 connects to part 120 through the interface 110. In assembly variants 100 and 102, the connection for parts are the same except that part 116 connects to part 122 through the interface 110. Each connection of a part usage requires three definitions. The first two definitions are mechanical port definitions on each part usage. The third definition is the relationship between the two that determines the orientation of respective part usages through ports located on each part.

Logical part usages are permitted to have logical ports. A port of a part usage can connect to a logical port of a logical part usage, which indicates that the logical port is implemented by a port of the part usage. For each assembly configuration, the logical part usage connection through a logical port will have the same effect, as if a normal part usage port to part usage port connection had been created.

A candidate product data model 129 includes a first relationship 130, second relationship 132 and third relationship 134, each linking a component usage port to a logical component usage port, as represented by the solid section of these links. The dotted section of the links represents alternative implementations of that logical part usage port by particular part usage ports. The fourth relationship 136 links two component usage's ports.

Figure 9:
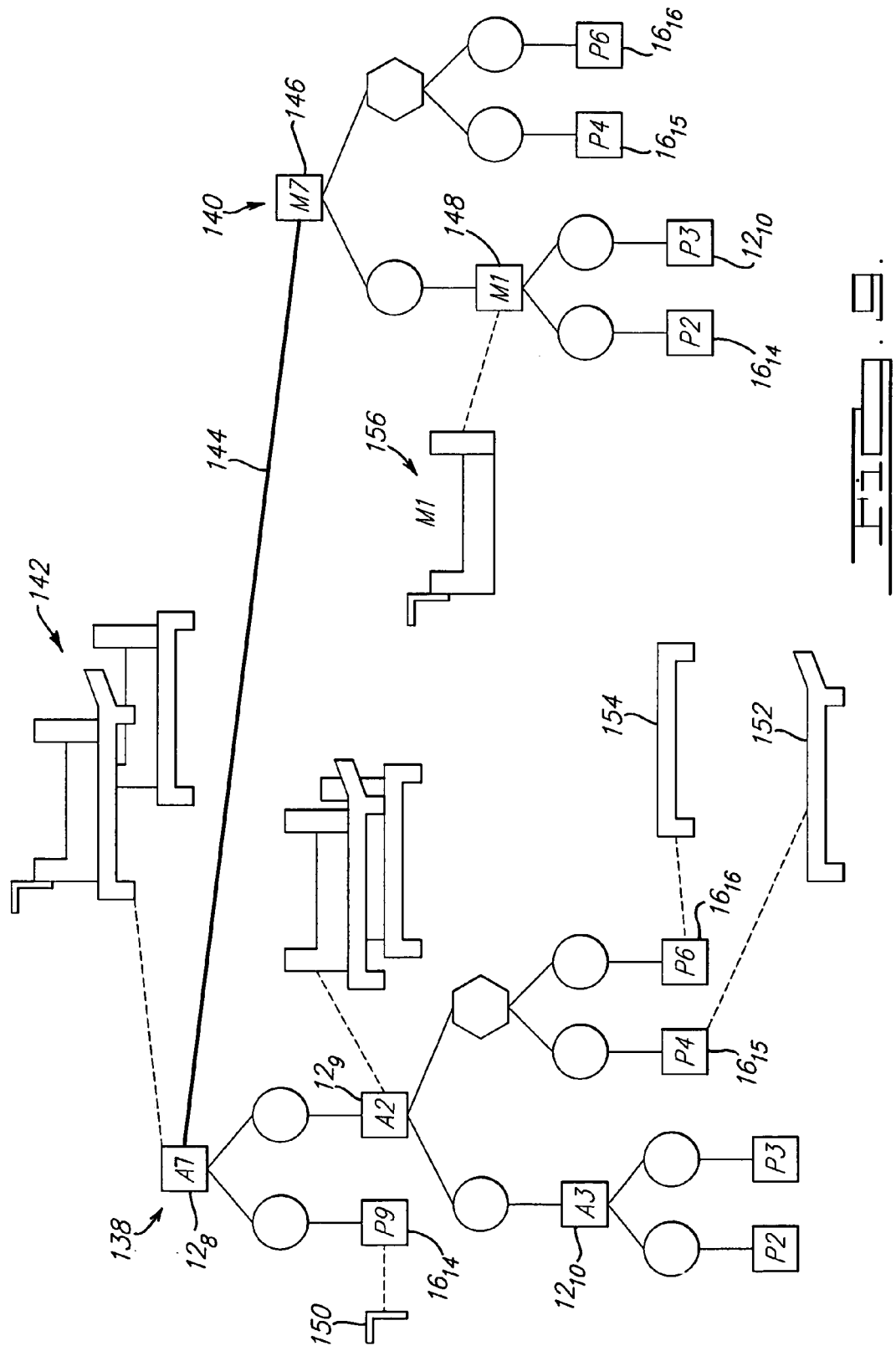
FIG. 9 shows an illustration of a mapping between two domains: 1. engineering, geometric CAD, and 2. manufacturing assembly sequence.

Another application of the present invention is to capture mapping between the engineering CAD assembly design domain and the manufacturing assembly sequence design domain. FIG. 9 shows an illustration of such a mapping. The third product data model graph 138 is a representation of a parent assembly $12_8$ with an inside label of "A7". The parent assembly $12_8$ has two variants shown as twin variants 142. The manufacturing assembly sequence 140 includes a first manufacturing assembly 146 and a second manufacturing assembly 148. The parent assembly 128 is fully reproduced by the first manufacturing assembly 146 as identified by a relationship link 144. The second manufacturing assembly 148 consists of a flange part 150 represented by a child component $16_{14}$ and the assembly $12_{10}$. The child components $16_{15}$ and $16_{16}$ represent a base 152 and a base 154, respectively. The second manufacturing assembly 148 is a representation of a part assembly 156. Thus, the first manufacturing assembly 146 is constructed from a combination of the second manufacturing assembly 148 and either child component $16_{15}$ or $16_{16}$.

Figure 10:
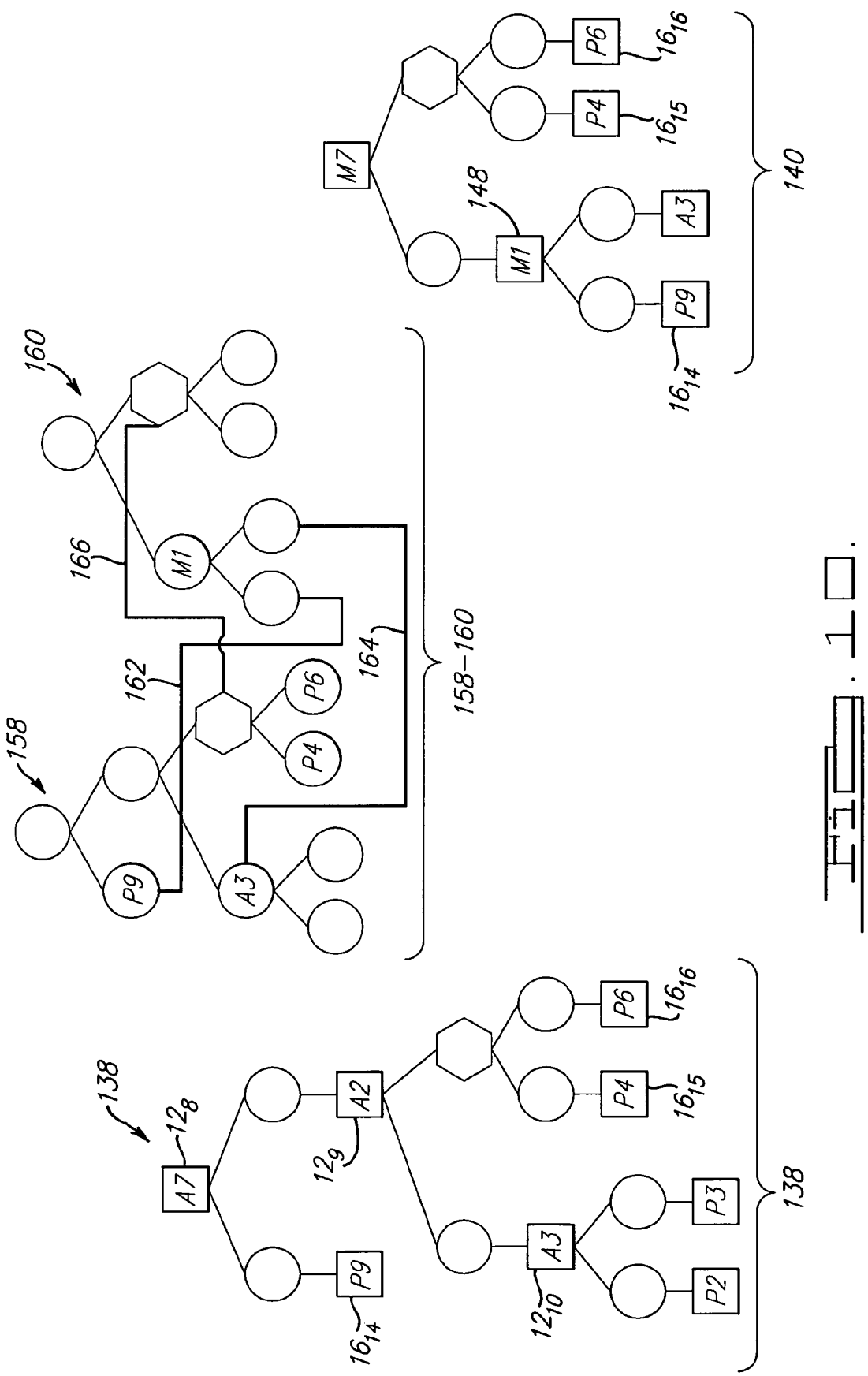
FIG. 10 shows occurrence trees for mapping between the two design domains.

FIG. 10 shows occurrence structures as trees for mapping the engineering CAD assembly domain to the manufacturing assembly sequence domain. The CAD tree 158 and the manufacturing tree 160 are used to map relationships between third graph 138 and the manufacturing assembly sequence 140. Link 162 shows mapping of child component $16_{14}$ to the manufacturing assembly sequence. Link 164 shows mapping of assembly $12_{10}$ using occurrence nodes to the manufacturing assembly sequence. Link 166 shows mapping of logical occurrence nodes between the CAD tree 158 and the manufacturing tree 160. Instructions for adding base structural members represented by child components $16_{15}$ and $16_{16}$ can be conveniently shared since there is only one logical mapping between the CAD tree 158 and the manufacturing tree 160.

The product data model and the associated structures may be preferably stored in computer-associated memories, which may be random-access memories, persistent datastores, databases or files.

Figure 11:
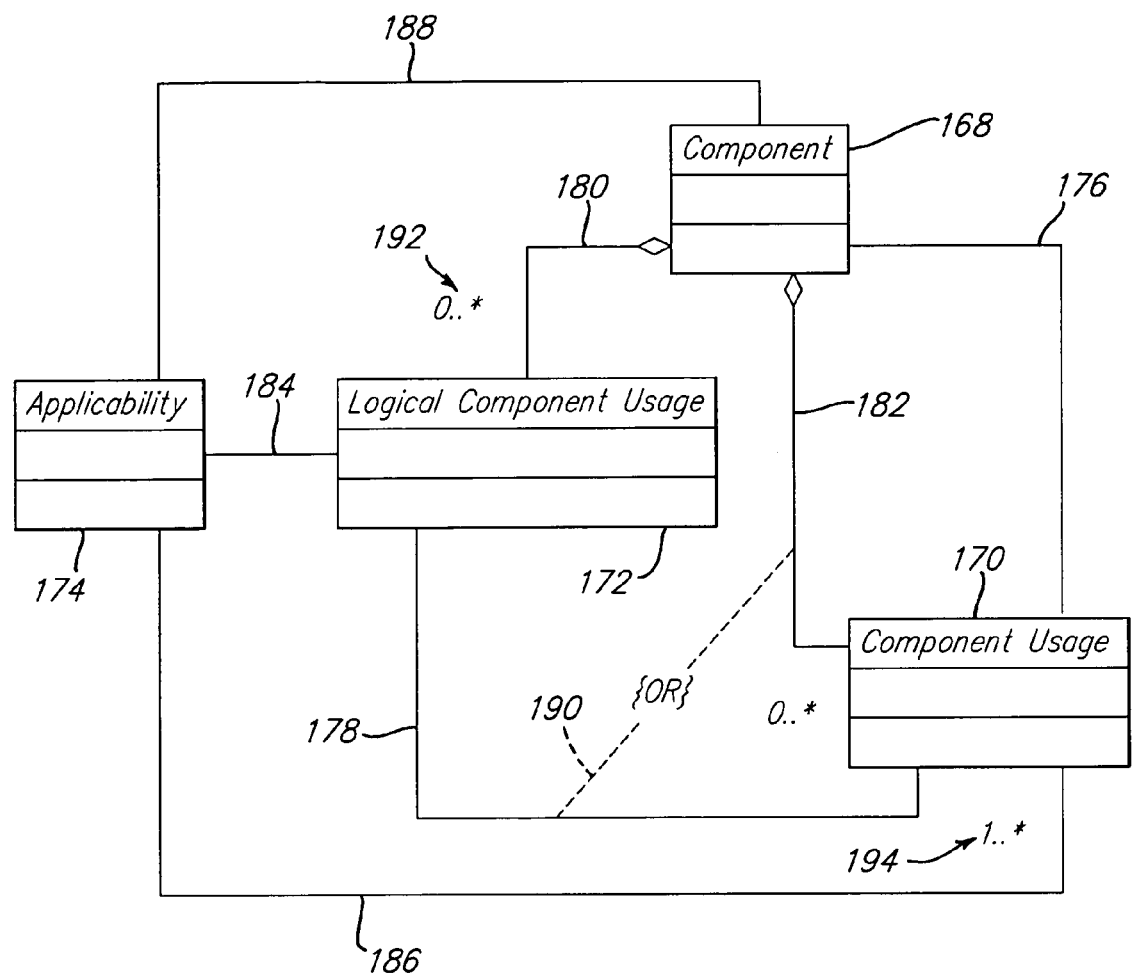
FIG. 11 shows a Unified Modeling Language (UML) representation of the Component, Component Usage and Logical Component Usage object definitions, with a notional representation of an applicability object.

FIG. 11 shows a Unified Modeling Language (UML) representation of the logical component usage extension to the traditional product data model. The component object 168, via third relationship 180, can have zero or more logical component usage objects 172 as children. Similarly, the component object 168, via fourth relationship 182, can have zero or more component usage objects 170 as children. The logical component usage objects 172, via second relationship 178, may have one or more component usage objects 170 as children. The dotted line 190 connecting second relationship 178 to fourth relationship 182 with the symbol {OR} in the middle is a constraint relationship. This means that a particular component usage object 170 may be connected to either a logical component usage object 172, via relationship 178, or to a component object 168, via relationship 182, but both relationships may not be present simultaneously. Each component usage object 170, via first relationship 176, is connected to one and only one child component object 168. The applicability object 174 represents a general, notional mechanism for expressing to which particular configuration each logical component usage 172 and component usage 170 is applicable. Fifth relationship 184 and sixth relationship 186 carry that applicability information, and seventh relationship 188 connotes the fact that for some applicability schemes the parent assembly configuration can directly control usage applicability. Note that 0 . . . *, 192 means zero or more, and 1 . . . *, 194 means one or more.

The present invention provides a product data model for representing storing product related information in a memory of an electronic device, such as a computer. The product data model is flexible and versatile to allow sharing of product information within product families and applications.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A non-redundant, product data model system stored in a memory associated with a computer for organizing and defining relationships for components and subassemblies being modeled, said product data-model system including product information about at least one component definition, an instance of which is a constituent of one parent assembly definition, the system comprising:
    at least one component-usage for holding information relating to an instance of a component definition;
    one or more logical component-usages for non-redundantly holding information relating to logical elements of their parent assembly definition, said logical component-usages being operatively connected to one or more of said component-usages as children, each of which implements one of said logical elements;
    said component-usages being operatively connected to either the parent assembly definition or one said logical component-usage;
    each configuration of said parent assembly definition containing all said child component-usages that connect directly to it, whose applicability object evaluates to true, and must also contain one and only one said child component-usage of each said logical component-usage whose applicability expression evaluates to true.

2. A method for forming a data-model that organizes and defines relationships between information representing product data, in a memory, the method comprising:
    constructing one or more assembly definitions;
    constructing at least one component-usage for non-redundantly holding information relating to an instance of exactly one component definition;
    at least one logical component-usage non-redundantly associated with said component-usages, said logical component-usages non-redundantly connecting to said component-usages; and
    said component-usages associated with exactly one said parent assembly definition or exactly one said logical component-usage;
    each configuration of said parent assembly definition containing all said child component-usages that connect directly to it, whose applicability object evaluates to true, and also contains only one said child component-usage of each said logical component-usage whose applicability expression evaluates to true.

3. The method of claim 2, further comprising:
    capturing product data for a product family;
    storing captured product data for said product family in said product data-model; and
    modeling computationally said product family using said product data-model.

4. The method of claim 3, further comprising:
    capturing product data for an assembly having at least one variant;
    storing captured product data for said variants in said product data-model; and
    constructing a reduced duplication of computer-aided-design data to capture a number of design variations within a product family using said product data-model.

5. A method for forming a data-model that organizes and defines assembly configurations using a generalized occurrence structure, the data-model being stored in a memory, the method comprising:
    (a) constructing a plurality of occurrence nodes corresponding to paths in a representation of a product data-model comprising a non-redundant, hierarchically interconnected parent assembly definition, at least one child component-usage, and at least one logical component-usage;
    (b) constructing non-redundant, logical occurrence nodes associated with one or more of said occurrences nodes;
    (c) storing product data in said occurrence nodes; and
    each configuration of said parent assembly definition containing all said child component-usages that connect directly to it, whose applicability object evaluates to true, and also contains only one said child component-usage of each said logical component-usage whose applicability expression evaluates to true.

6. The method of claim 5, step (a) further comprising:
    associating a plurality of part-interfaces with said occurrence nodes;
    associating a plurality of part usages with a plurality of logical occurrence nodes depending upon logical relationships between said part-usages; and
    forming a mapping of a plurality of computer-aided-designs of said parts with said product data-model.

7. The method of claim 5, wherein said step (a) further comprises:
    forming a mapping of at least one manufacturing assembly sequence to at least one computer-aided-design that is stored in said product data model, said manufacturing assembly sequence comprising a plurality of manufacturing assemblies which include a plurality of components and a plurality of assemblies, said mapping consisting of relationships between logical component usages and component-usages one in the manufacturing product structure and one in the computer-aided-design (geometric) structure.

8. The method of claim 5, wherein said step (a) further comprises:
    forming a mapping from of a subset of the product data model, for any design domain of a given product family, to a subset of any other design domain representing another design aspect of the same product family.

9. The method of claim 5, wherein said step (a) further comprises:
    forming a mapping from a whole of the product data model, for any design domain of a given product family, and part or all of any other design domain representing another aspect of the design of the same product family.

10. A non-redundant, product data-model system stored in one of a memory and a database associated with a computer, for organizing and modeling components and relationships of a product data model, said product data-model system including product information about at least one component definition, an instance of which is a constituent of one parent assembly definition, the system comprising:

at least one component-usage for holding information relating to one or more instances of a component definition;

at least one logical component-usage for non-redundantly holding information relating to logical elements of their parent assembly definition, said logical component-usages each being operatively connected to one or more of said component-usages as children, each of which implements its associated said logical element;

said component-usages being operatively connected to either the parent assembly definition or one said logical component-usage; and each configuration of said parent assembly definition containing all said child component-usages that connect directly to it, whose associated applicability object evaluates to true, each configuration of said parent assembly definition also containing one and only one child component-usage of each logical component-usage, whose associated applicability object evaluates to true.

* * * * *